(12) United States Patent
Qiu et al.

(10) Patent No.: US 8,545,074 B2
(45) Date of Patent: Oct. 1, 2013

(54) ELECTRONIC DEVICE HAVING LIGHT EMITTING MODULE AND LIGHT GUIDING MEMBER

(75) Inventors: Ji-Feng Qiu, Shenzhen (CN); Hong Li, Shenzhen (CN); Xiao-Hui Zhou, Shenzhen (CN); Rui Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 119 days.

(21) Appl. No.: 13/241,128

(22) Filed: Sep. 22, 2011

(65) Prior Publication Data

US 2013/0003386 A1  Jan. 3, 2013

(30) Foreign Application Priority Data

Jun. 30, 2011  (CN) .......................... 2011 1 0182041

(51) Int. Cl.
*F21V 7/04* (2006.01)

(52) U.S. Cl.
USPC ......................................... 362/551; 362/555

(58) Field of Classification Search
USPC .................. 362/23.16, 23.17, 555, 632–634, 362/85, 577–579, 551, 23.07, 23.08, 23.09, 362/23.1, 23.11
See application file for complete search history.

(56) References Cited

U.S. PATENT DOCUMENTS

| | | | | |
|---|---|---|---|---|
| 5,938,324 | A * | 8/1999 | Salmon et al. | 362/555 |
| 6,685,351 | B2 * | 2/2004 | Chen | 362/555 |
| 6,860,627 | B2 * | 3/2005 | Hsieh | 362/551 |
| 7,046,906 | B1 * | 5/2006 | Cho | 385/146 |
| 7,458,705 | B2 * | 12/2008 | Chiba et al. | 362/362 |
| 8,366,306 | B2 * | 2/2013 | Hsieh et al. | 362/555 |
| 2007/0211489 | A1 * | 9/2007 | Li et al. | 362/551 |

* cited by examiner

*Primary Examiner* — Robert May
(74) *Attorney, Agent, or Firm* — Altis Law Group, Inc.

(57) ABSTRACT

An electronic device includes a housing having a lower base and an upper cover disposed on the lower base, a light emitting module received in the housing, two arms extending downwardly from the upper cover, and a light guiding member facing the light emitting module and fixed between the two arms.

12 Claims, 7 Drawing Sheets

ELECTRONIC DEVICE HAVING LIGHT EMITTING MODULE AND LIGHT GUIDING MEMBER

TECHNICAL FIELD

The present disclosure relates to electronic devices, and more particularly, to an electronic device having a light emitting module and a light guiding member guiding light emitted by the light emitting module.

DESCRIPTION OF THE RELATED ART

An electronic device, such as a DVD (Digital Video Disc) player, generally includes a housing, a light emitting module received in the housing, and at least one light guiding member for guiding light emitted by the light emitting module to transmit through the housing, thereby showing a working status of the DVD player. The light guiding member is usually fixed in the housing in a manner of heating fusion. However, in this situation, the light guiding member sometimes is not readily fixed in the housing.

Therefore, it is desirable to provide an electronic device which can overcome the described limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the present electronic device for microminiaturization. Moreover, in the drawings, like reference numerals designate corresponding parts throughout the whole views.

DETAILED DESCRIPTION

Reference will now be made to the drawings to describe the exemplary embodiments in detail.

Figure 1:
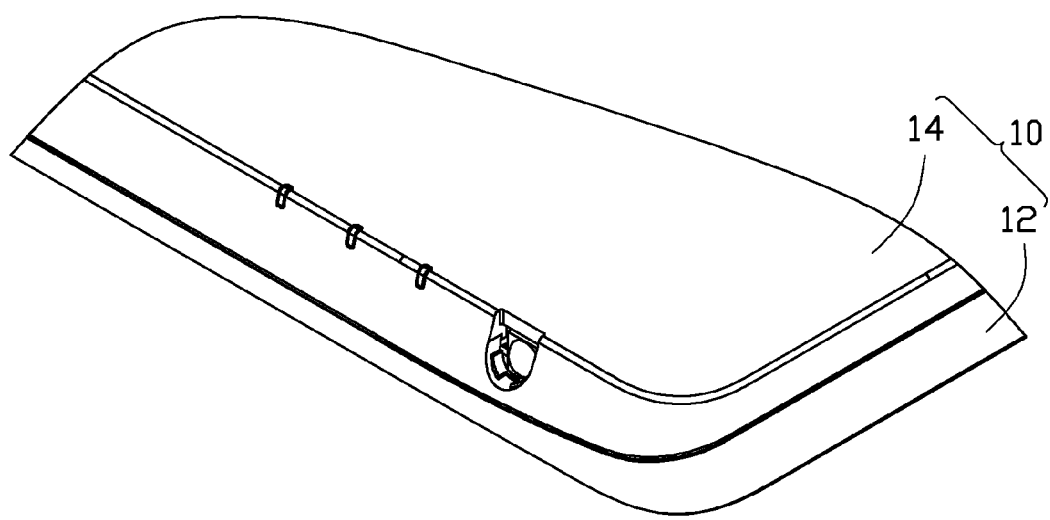
FIG. 1 shows a partial assembled, schematic view of an electronic device in accordance with an embodiment of the present disclosure.
Figure 2:
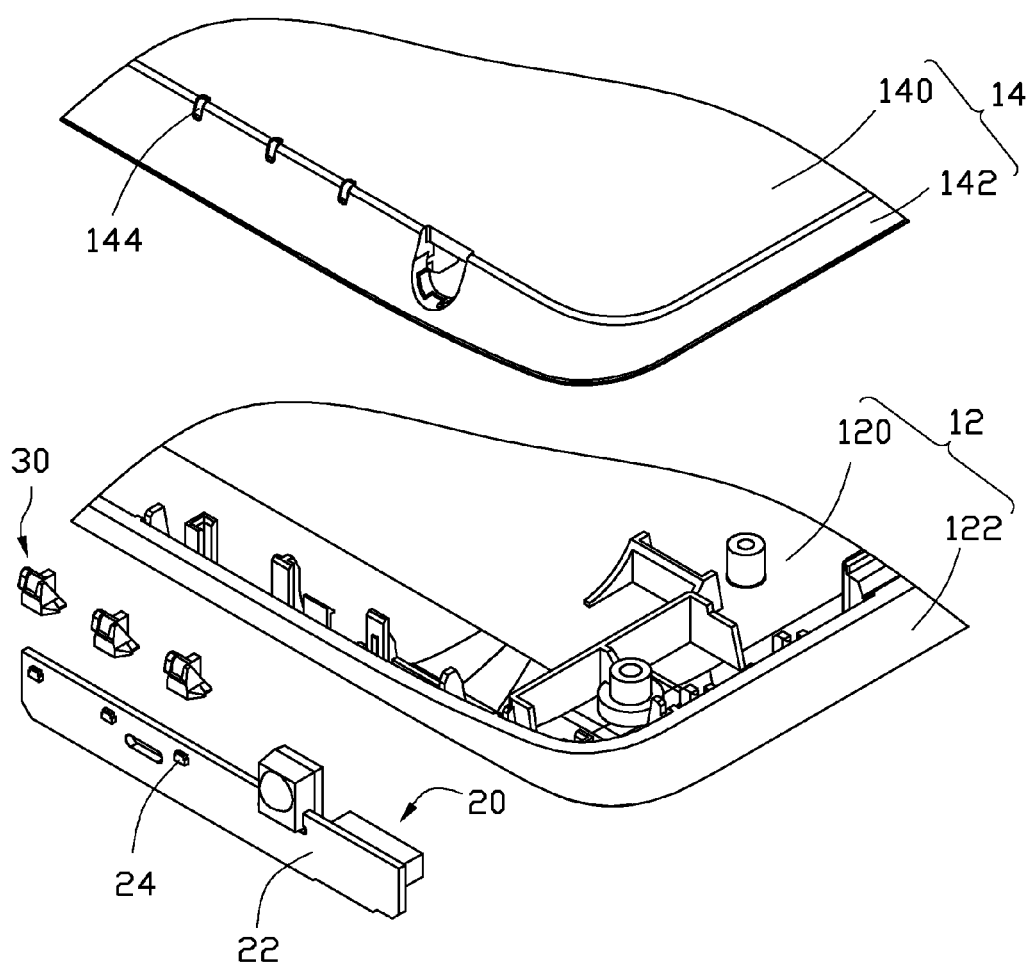
FIG. 2 is an exploded view of FIG. 1.

Referring to FIG. 1 and FIG. 2, an electronic device in accordance with an embodiment of the present disclosure is disclosed. The electronic device includes a housing 10, a light emitting module 20 received in the housing 10, and a plurality of light guiding members 30 fixed in the housing 10 and facing the light emitting module 20.

The housing 10 includes a lower base 12, and an upper cover 14 correspondingly disposed on the lower base 12. The lower base 12 includes a base plate 120, and a frame-shaped first sidewall 122 extending upwardly from an outer periphery of the base plate 120. The upper cover 14 includes a cover plate 140, and a frame-shaped second sidewall 142 extending downwardly from an outer periphery of the cover plate 140. The base plate 120 is located opposite to the cover plate 140. The second sidewall 142 is correspondingly placed on the first sidewall 122.

The light emitting module 20 includes an elongated printed circuit board 22 and a plurality of LEDs 24 evenly mounted on the printed circuit board 22. The printed circuit board 22 is upright fixed on the base plate 122, and located adjacent to a lateral side of the first sidewall 120. The LEDs 24 are mounted on a face of the printed circuit board 22 facing the lateral side of the first sidewall 120. The LEDs 24 extend into a room defined by the upper cover 14. A plurality of through holes 144 are defined in the upper cover 14 corresponding to the LEDs 24 of the light emitting module 20. Light emitted from the LEDs 24 is correspondingly transmitted through the through holes 144 to an outer environment.

Figure 3:
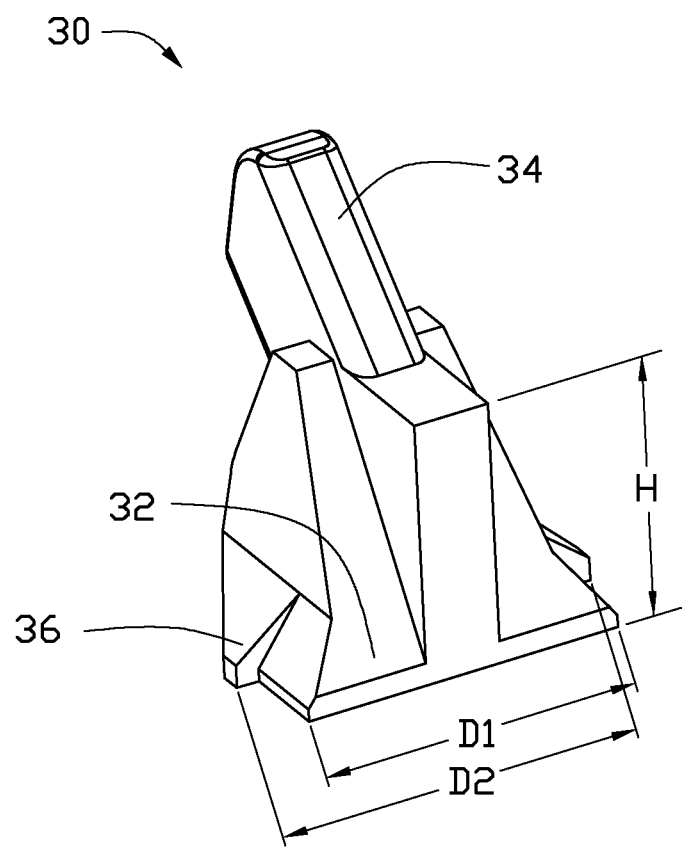
FIG. 3 is an enlarged view of a light guiding member of the electronic device in FIG. 2.
Figure 4:
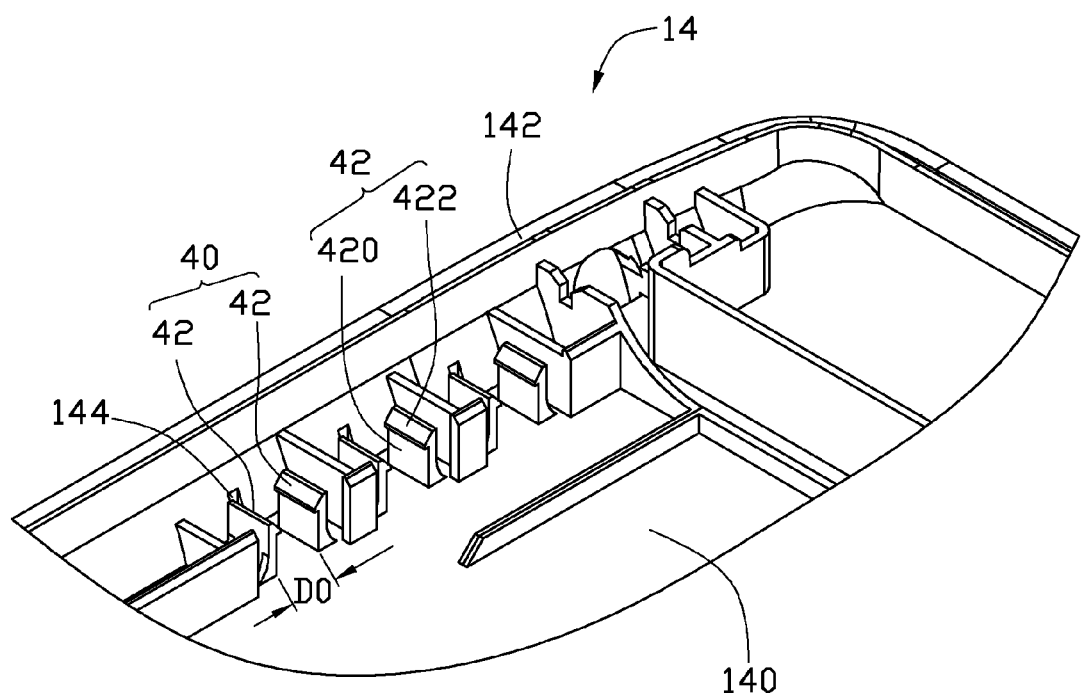
FIG. 4 is an inverted, enlarged view of an upper cover of the electronic device of FIG. 2.

Referring to FIGS. 3 and 4 also, a plurality of fixing members 40 are formed on a bottom face of the cover plate 140 towards the LEDs 24 of the light emitting module 20, respectively. Each fixing member 40 includes two arms 42 juxtaposed to each other. Each arm 42 includes a main body 420 extending downwardly from the bottom face of the cover plate 140 and a hook 422 bent inwardly from a distal end of the main body 420. The fixing members 40 are spaced from each other and located adjacent to a lateral side of the second sidewall 142. The fixing members 40 are correspondingly located aside the LEDs 24. Each fixing member 40 is located adjacent to a corresponding through hole 144. Each through hole 144 corresponds to a position between the two arms 42 of a corresponding fixing remember 40.

Each light guiding member 30 includes a base portion 32, a light guiding portion 34 extending upwardly and inclinedly from a top of the base portion 32, and two wings 36 extending outwardly from two opposite lateral sides of the base portion 32, respectively. Each light guiding member 30 is made of epoxy silicone, polycarbonate, polymethylmethacrylate or other transparent materials. A width D1 of the base portion 32 is equal to or smaller than a distance D0 between the two main bodies 420 of the two arms 42 of each fixing member 40. A distance D2 between outmost ends of the two wings 36 is larger than the distance D0. A height H of the base portion 32 is equal to a distance between the hooks 422 of each fixing member 40 and the cover plate 140.

Figure 5:
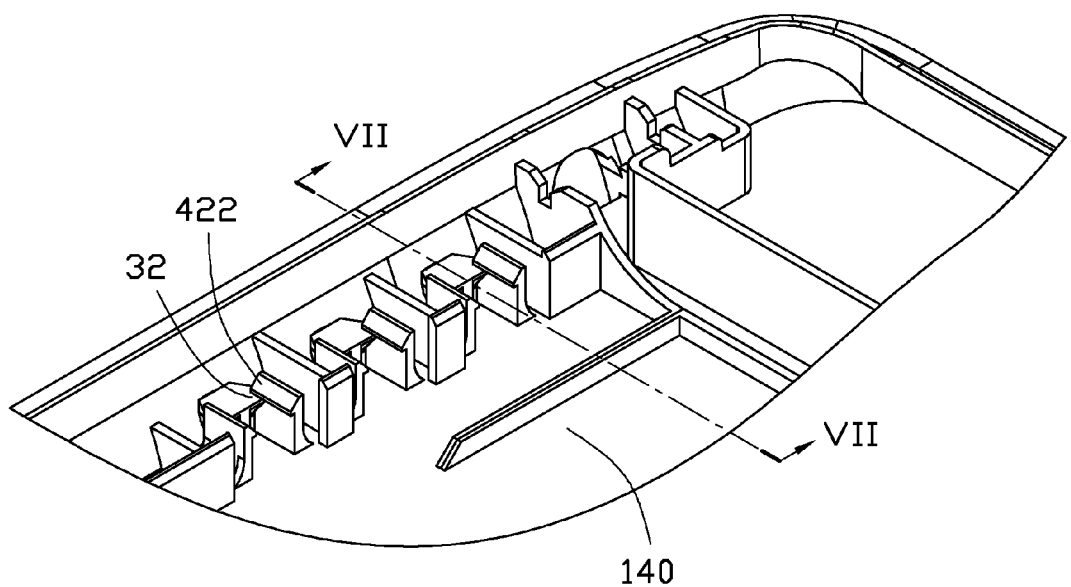
FIG. 5 is similar to FIG. 4, but showing a plurality of light guiding members assembled on the cover.
Figure 6:
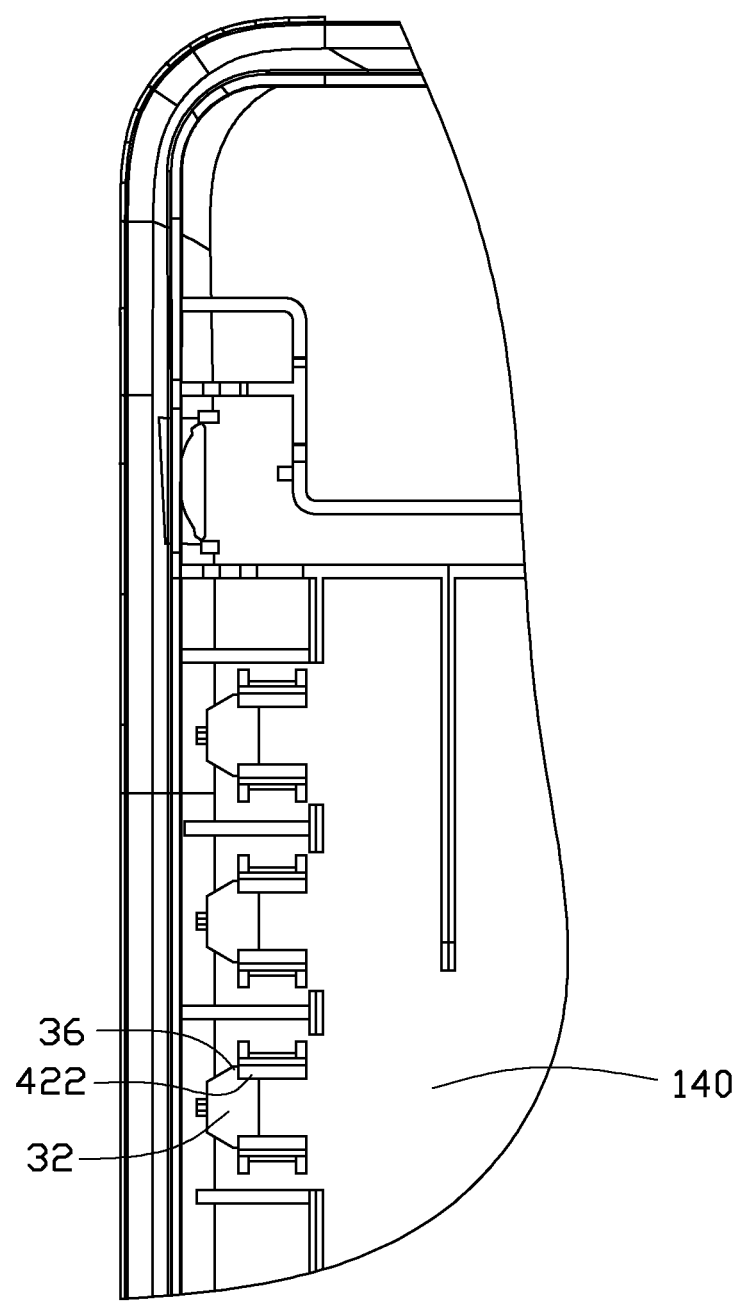
FIG. 6 is similar to FIG. 5, but viewed from a bottom of the upper cover.
Figure 7:
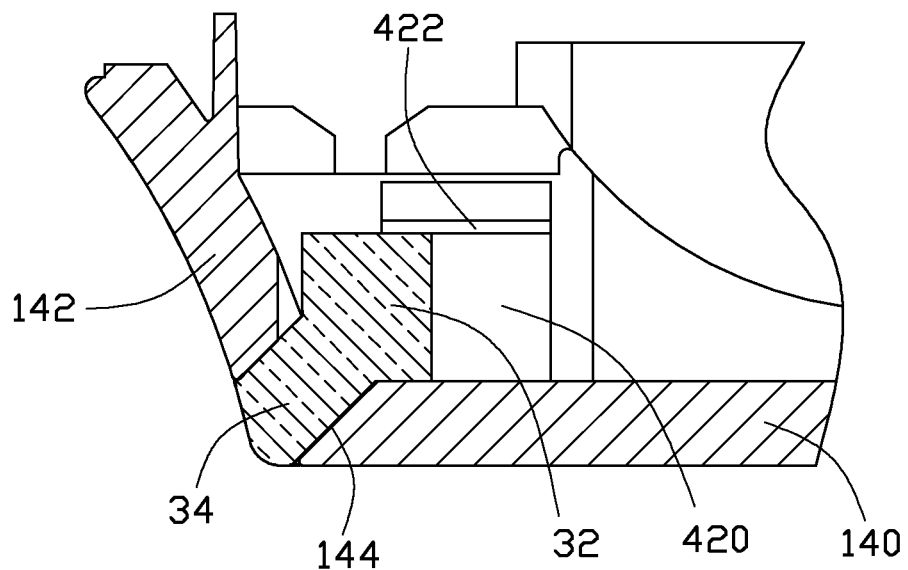
FIG. 7 is a cross sectional view of FIG. 5, taken along a line VII-VII thereof.

Referring to FIGS. 5-7 also, in assembling one of the light guiding members 30 on a corresponding fixing member 40, the base portion 32 of the light guiding member 30 is sandwiched between the two main bodies 420 of the two arms 42 of the fixing member 40. The two hooks 422 of the two arms 42 abut the base portion 32 against the cover plate 140. The two wings 36 of the light guiding member 30 are located between the fixing member 40 and the lateral side of the second sidewall 142. The two wings 36 abut the two main bodies 420 of the two arms 42 of the fixing member 40, respectively. Thus, the light guiding member 30 is readily and fittingly fixed to the upper cover 14 via the fixing member 40. The light guiding portion 34 of the light guiding member 30 protrudes from the base portion 32 towards a corresponding through hole 144, and the light guiding portion 34 is fitly received in the corresponding through hole 144.

The light emitted from the LEDs 24 enters the light guiding members 30 and is correspondingly guided by the light guiding portions 34 of the light guiding members 30, and transmitted through the through holes 144 to the outer environment.

It is to be understood, however, that even though multiple characteristics and advantages of the disclosure have been set forth in the foregoing description, together with details of the structure and function of the invention disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device, comprising:
a housing having a lower base and an upper cover disposed on the lower base;
a light emitting module received in the housing;
two arms extending downwardly from the upper cover; and
a light guiding member facing the light emitting module, and fixed between the two arms;
wherein a through hole is defined in the upper cover, the through hole corresponds to a position between the two arms and adjacent to the light guiding member and light emitted by the light emitting module is guided by the light guiding member and transmitted through the through hole;
wherein each arm comprises a main body extending downwardly from a bottom of the upper cover towards the bottom base and a hook bent inwardly from a distal end of the main body;
wherein the light guiding member comprises a base portion, a light guiding portion extending outwardly and inclinedly from the base portion, and two wings extending outwardly from two opposite lateral sides of the base portion, respectively;
wherein the upper cover comprises a cover plate, and a frame-shaped sidewall extending downwardly from an outer periphery of the cover plate, the through hole being defined in the sidewall;
wherein the main body of one of the two arms and the main body of the other of the two arms extend downwardly from a bottom face of the cover plate and are located adjacent to a lateral side of the sidewall with the through hole; and
wherein the two wings are located between the two arms and the lateral side of the sidewall, and the two wings abut the main body of one of the two arms and the main body of the other of the two arms, respectively.

2. The electronic device as claimed in claim 1, wherein the two arms are juxtaposed to each other.

3. The electronic device as claimed in claim 1, wherein the base portion of the light guiding member is sandwiched between the main body of one of the two arms and the main body of the other of the two arms.

4. The electronic device as claimed in claim 3, wherein a width of the base portion is equal to or smaller than a distance between the main body of one of the two arms and the main body of the other of the two arms.

5. The electronic device as claimed in claim 1, wherein the hook of one of the two arms and the hook of the other of the two arms abut the base portion against the upper cover.

6. The electronic device as claimed in claim 5, wherein a height of the base portion is equal to a distance between the hook of the arm and the upper cover.

7. The electronic device as claimed in claim 1, wherein a distance between distal ends of the two wings is larger than that between the main body of one of the two arms and the main body of the other of the two arms.

8. The electronic device as claimed in claim 1, wherein the light guiding portion of the light guiding member protrudes from the base portion towards the through hole, and the light emitted by the light emitting module are reflected by the light guiding portion.

9. An electronic device, comprising:
a housing having a lower base and an upper cover disposed on the lower base, and a through hole being defined in the upper cover;
a light emitting module received in the housing;
a fixing member formed in the housing and aligned with the through hole; and
a light guiding member fixed on the fixing member, and light emitted by the light emitting module being guided by the light guiding member, and transmitted through the through hole;
wherein the fixing member comprises two arms juxtaposed to each other, and each arm comprises a main body extending downwardly from a bottom of the upper cover and a hook bent inwardly from a distal end of the main body;
wherein the light guiding member comprises a base portion, a light guiding portion extending outwardly and inclinedly from the base portion, and two wings extending outwardly from two opposite lateral sides of the base portion, respectively; and
wherein a distance between distal ends of the two wings is larger than that between the main body of one of the two arms and the main body of the other of the two arms, and the two wings abut lateral sides of the main body of one of the two arms and the main body of the other of the two arms, respectively.

10. The electronic device as claimed in claim 9, wherein the base portion of the light guiding member is sandwiched between the main body of one of the two arms and the main body of the other of the two arms.

11. The electronic device as claimed in claim 9, wherein the hook of one of the two arms and the hook of the other of the two arms abut the base portion against the upper cover.

12. An electronic device, comprising:
a housing having a lower base and an upper cover disposed on the lower base;
a light emitting module received in the housing;
two arms extending downwardly from the upper cover; and
a light guiding member facing the light emitting module, and fixed between the two arms;
wherein a through hole is defined in the upper cover, the through hole corresponds to a position between the two arms and adjacent to the light guiding member, and light emitted by the light emitting module is guided by the light guiding member and transmitted through the through hole;
wherein each arm comprises a main body extending downwardly from a bottom of the upper cover towards the bottom base and a hook bent inwardly from a distal end of the main body;
wherein the light guiding member comprises a base portion, a light guiding portion extending outwardly and inclinedly from the base portion, and two wings extending outwardly from two opposite lateral sides of the base portion, respectively; and
wherein the light guiding portion of the light guiding member protrudes from the base portion towards the through hole, and the light emitted by the light emitting module are reflected by the light guiding portion.

* * * * *